United States Patent
Chen et al.

(10) Patent No.: US 9,484,911 B2
(45) Date of Patent: Nov. 1, 2016

(54) OUTPUT DRIVER WITH BACK-POWERING PREVENTION

(71) Applicant: QUALCOMM Incorporated, San Diego, CA (US)

(72) Inventors: Wilson Jianbo Chen, San Diego, CA (US); Chiew-Guan Tan, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/631,347

(22) Filed: Feb. 25, 2015

(65) Prior Publication Data

US 2016/0248418 A1    Aug. 25, 2016

(51) Int. Cl.
*H03K 3/01* (2006.01)
*H03K 17/26* (2006.01)
*H03K 17/18* (2006.01)

(52) U.S. Cl.
CPC .............. *H03K 17/26* (2013.01); *H03K 17/18* (2013.01)

(58) Field of Classification Search
USPC ................ 327/108–112, 379, 389, 391; 326/22–27, 81–87
See application file for complete search history.

(56) References Cited

U.S. PATENT DOCUMENTS

| | | | | |
|---|---|---|---|---|
| 5,160,855 A | * | 11/1992 | Dobberpuhl ... | H03K 19/018521 326/62 |
| 5,576,635 A | * | 11/1996 | Partovi .................. | G05F 3/242 326/27 |
| 5,635,861 A | * | 6/1997 | Chan ................ | H03K 19/00315 326/17 |
| 5,844,425 A | | 12/1998 | Nguyen et al. | |
| 6,064,231 A | | 5/2000 | Kothandaraman et al. | |
| 6,150,843 A | | 11/2000 | Shiffer et al. | |
| 6,265,926 B1 | * | 7/2001 | Wong ................ | H03K 19/00315 326/81 |
| 6,351,158 B1 | * | 2/2002 | Shearon ........... | H03K 19/00315 326/22 |
| 6,353,333 B1 | * | 3/2002 | Curd ................ | H03K 19/00315 326/57 |
| 6,861,874 B1 | * | 3/2005 | Chen ................ | H03K 19/00315 326/81 |
| 6,867,957 B1 | | 3/2005 | Tong et al. | |
| 7,180,331 B2 | | 2/2007 | Gosmain et al. | |
| 7,239,176 B2 | * | 7/2007 | Gupta .............. | H03K 19/00315 326/68 |
| 7,477,075 B2 | * | 1/2009 | Kesselring ....... | H03K 19/00315 326/82 |
| 2004/0189345 A1 | | 9/2004 | Ker et al. | |

FOREIGN PATENT DOCUMENTS

EP        0704973 A2    4/1996
WO    WO-9837634 A1    8/1998

OTHER PUBLICATIONS

International Search Report and Written Opinion—PCT/US2016/014990—ISA/EPO—Apr. 15, 2016.

* cited by examiner

*Primary Examiner* — Brandon S Cole
(74) *Attorney, Agent, or Firm* — Haynes and Boone, LLP

(57) ABSTRACT

A back-power prevention circuit is provided that protects a buffer transistor from back-power during a back-power condition by charging a signal lead coupled to a gate of the buffer transistor to a pad voltage and by charging a body of the buffer transistor to the pad voltage.

20 Claims, 4 Drawing Sheets

OUTPUT DRIVER WITH BACK-POWERING PREVENTION

TECHNICAL FIELD

This application relates to back-powering prevention, and more particularly to an output driver with back-powering prevention.

BACKGROUND

To reduce power consumption, it is conventional to power down or turn off some of the system's integrated circuits in certain modes of operation. An active integrated circuit may then not be aware as to whether other integrated circuits in the same system are powered on or off. If the active integrated circuit attempts to communicate with a powered-off integrated circuit by driving it with an input signal, the resulting "back-power" applied to the inactive integrated circuit may cause the dissipation of relatively large amounts of current. In addition, the back-power may force the inactive integrated circuit into undesirable modes of operation when the inactive integrated circuit subsequently transitions into normal operation, leading to unexpected behaviors or glitches.

The back-power problem may be better appreciated with reference to an example system 100 as shown in FIG. 1. A first integrated circuit 105 is active so that its output buffer A1 continues to drive a binary high (a power supply voltage) signal to an inactive integrated circuit 110. The receiving pin RX on inactive integrated circuit 110 couples to a receive buffer (not illustrated) and also to an output buffer formed by a stack of a PMOS transistor MP and an NMOS transistor MN. During normal operation of integrated circuit 110, a pre-driver circuit drives the gates of transistors MP and MN to produce a desired output signal. However, during the inactive mode in which integrated circuit 110 is powered down, both gates of transistors MP and MN discharge to ground. As is conventional, integrated circuit 110 includes an electrostatic discharge (ESD) protection diode D1 that couples between the RX pin and a power supply rail PX. Another ESD protection diode D2 couples between ground and the RX pin. Since the PX rail is powered down when integrated circuit 110 is inactive, ESD diode D1 becomes forward biased such that an undesirable leakage current will flow from integrated circuit 105 into the PX rail. In turn, the PN junction between the drain for transistor MP and its n-well becomes forward biased and is represented by a parasitic diode D3. The resulting back-power current through ESD diode D1 and parasitic diode D3 into the PX rail and the n-well is represented in FIG. 1 as a back-power current path 115. This back-power current conduction not only wastes power but may also result in glitches or other undesirable states for integrated circuit 110 when it again is powered and attempts to resume normal operation.

Accordingly, there is a need in the art for low-power and compact solutions to the back-power problem.

SUMMARY

To provide a low-power and compact solution to the back-power problem, a protected integrated circuit is provided with a back-power prevention circuit that responds to a back-power condition. As used herein, a back-power state or condition exists when a remote integrated circuit drives an input/output (I/O) pin of the protected circuit with an asserted voltage signal while the protected circuit is powered down. The back-power prevention circuit protects a PMOS buffer transistor in the protected integrated circuit during the back-power condition by coupling both a gate and a body of the PMOS buffer transistor to the I/O pin. As used herein, the terms "pin" or "pad" are used generically to refer to whatever structure (pin, pad, etc.) over which an integrated circuit receives and sends signals. The gate and body of the PMOS buffer transistor are thus charged by the back-power prevention circuit to the I/O pin voltage during the back-power condition. This charging of its gate shuts off the PMOS buffer transistor to prevent back-power current from flowing through it. In addition, the charging of the PMOS buffer transistor body to the I/O pin voltage prevents the formation of a forward-biased parasitic diode within the PMOS buffer transistor during the back-power condition. Advantageously, the back-power prevention circuit requires no additional pins on the protected integrated circuit with regard to receiving control signals nor does it require any retooling or reprogramming of the remote integrated circuit. These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To provide a low-power and compact solution to the back-power problem, a first integrated circuit is provided with a back-power prevention circuit that responds to a back-power condition. As defined herein, a back-power state or condition exists when a second integrated circuit drives an input/output (I/O) pin of a first integrated circuit with a signal charged to a power supply voltage while the first integrated circuit is powered down. Referring again to FIG. 1, there are three paths that back-power current 115 takes: a first path through ESD diode DE a second path through parasitic diode D3 that arises from the forward-biased p-n junction in PMOS buffer transistor MP, and a third path from the drain of the PMOS buffer transistor MP to the drain of the NMOS buffer transistor MN. The first path through the ESD diode D1 is readily addressed using known techniques such as through snapback devices or coupling the ESD diode to a dedicated ESD floating bus. Accordingly, the back-power prevention circuit disclosed herein addresses the second and third current paths by biasing a gate and an n-well of the PMOS buffer transistor responsive to an assertion of the back-power condition Should the integrated circuit protected by the back-power prevention circuit be operating normally, the power rail for the PMOS buffer transistor in the integrated circuit's output buffer is charged to its power supply voltage level. This power rail for the PMOS buffer transistor is designated herein as a "PX" power supply rail such that its power supply voltage is also designated as the PX power supply voltage. The back-power prevention circuit biases the n-well for the PMOS buffer transistor to the PX supply voltage during normal operation. Should a back-power condition exist, the PX rail discharges to zero whereas the pin or pad for the output buffer is charged by a remote integrated circuit to a power supply voltage denoted herein as the "PADSIG" voltage. To prevent the formation of a forward-biased p-n junction in the PMOS buffer transistor, the back-power prevention circuit charges the n-well for the PMOS buffer transistor to the PADSIG voltage responsive to the assertion of the back-power condition.

Figure 1:
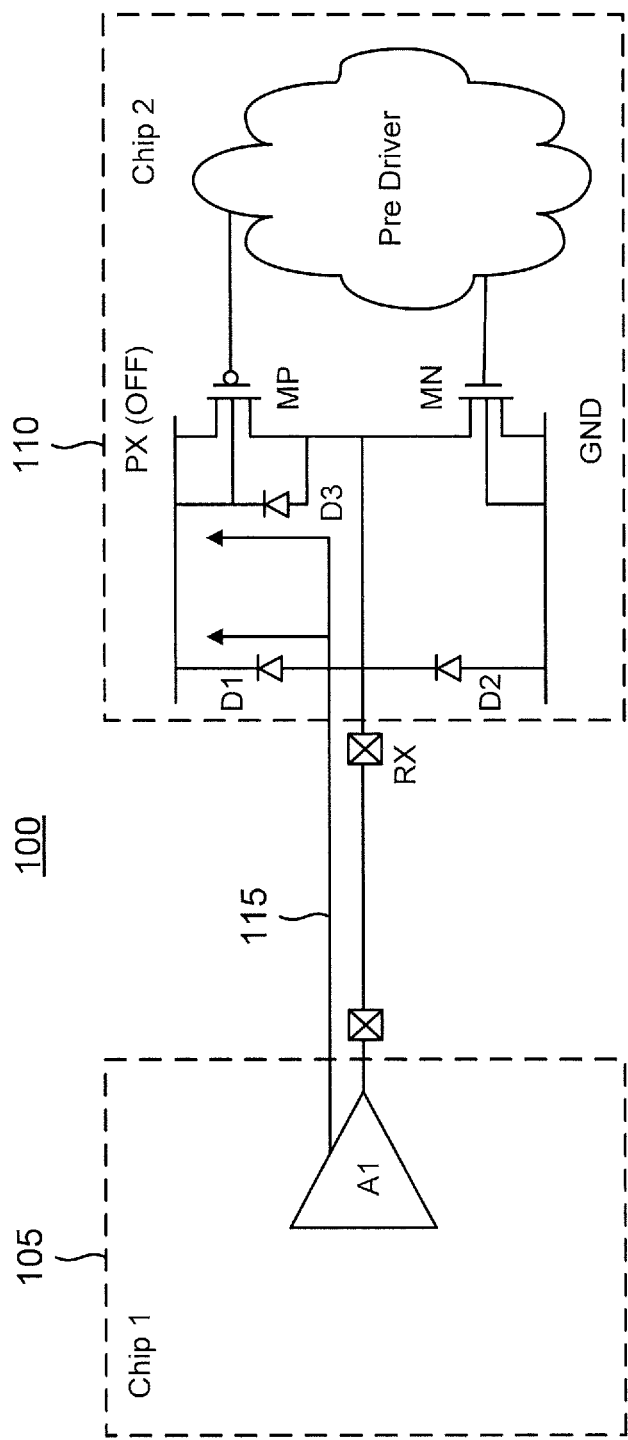
FIG. 1 is circuit diagram of a conventional system illustrating a back-power current path.

During normal operation, a pre-driver circuit drives a gate for the PMOS buffer transistor through a signal lead or control path in a conventional fashion as discussed with regard to FIG. 1. As the integrated circuit is powered down, the gate for a conventional PMOS buffer transistor would be grounded such that the PMOS buffer transistor would discharge to its drain responsive to the assertion of the PADSIG voltage. Such a back-power current discharge is deleterious as discussed previously in that it not only wastes power but may induce anomalous behavior upon resumption of a normal mode of operation. The back-power prevention circuit responds to an assertion of the back-power condition by charging the gate of the PMOS buffer transistor to the PADSIG voltage to ensure that the PMOS buffer transistor is switched off so as to prevent any back-power current discharge.

The asserted PADSIG voltage on the gate of PMOS buffer transistor could adversely affect the pre-driver circuit that couples to the gate through an output signal lead in that additional back-power current could drain from the charged signal lead into the pre-driver circuit. To address this issue, the back-power prevention circuit includes a transmission gate that couples between the pre-driver circuit and the PMOS buffer transistor's gate on the signal lead (which may also be denoted as a control path). In response to an assertion of the back-power condition, the back-power prevention circuit opens (switches off) the transmission gate to isolate the pre-driver circuit from the charged gate of the PMOS buffer transistor. These advantageous features may be better appreciated with regard to the following example embodiments.

Figure 2:
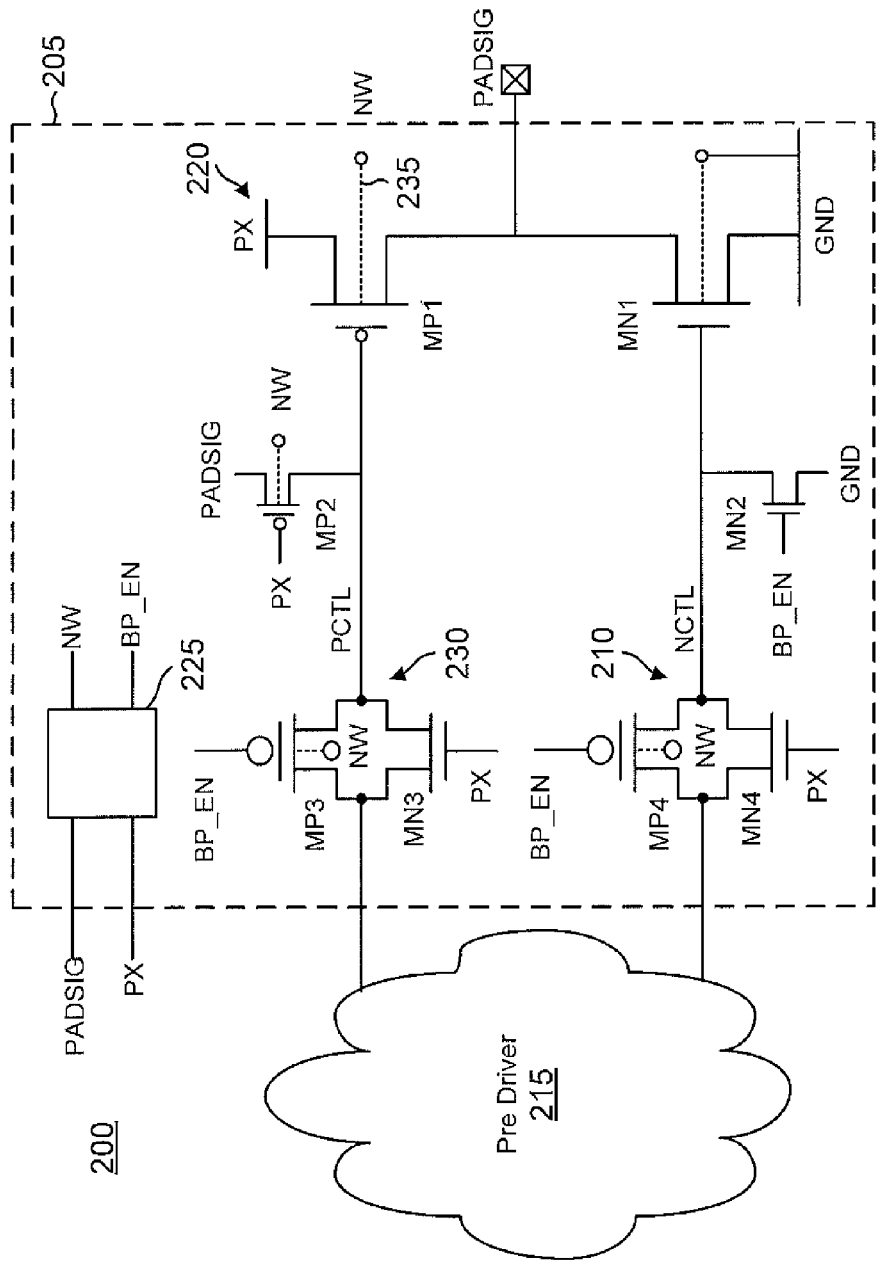
FIG. 2 is a circuit diagram of an integrated circuit configured with a back-power prevention circuit in accordance with an embodiment of the disclosure.

An integrated circuit 200 including an example back-power prevention circuit 205 is shown in FIG. 2. Back-power prevention circuit 205 couples between a pre-driver 215 and an input/output pad PADSIG. Pre-driver 215 drives an output buffer 220 that comprises a serial combination of a PMOS buffer transistor MP1 and an NMOS buffer transistor MN1. In particular, pre-driver 215 drives a gate of buffer transistor MP1 through a control path PCTL and also drives a gate of buffer transistor MN1 through a control path NCTL. The source of buffer transistor MN1 couples to ground whereas a source of buffer transistor MP1 couples to the PX power rail. The drains for buffer transistors MP1 and MN1 couple together to the PADSIG pad. As discussed previously, the PX power rail does not couple to the PADSIG pad through an ESD diode. There is thus no need to protect against a forward-biased ESD diode charging the PX power rail during a back-power condition.

In response to a back-power condition, the PX power rail will discharge towards ground when integrated circuit 200 is powered down. In such a case, however, what was the drain of buffer transistor MP1 may act as a source since the PADSIG voltage is asserted. In a conventional integrated circuit, the control path PCTL is discharged during a power-down of the integrated circuit such that buffer transistor MP1 is switched on and could then charge the PX power rail undesirably. To prevent this condition, back-power prevention circuit 205 includes a switch that closes in response to the assertion of the back-power condition to couple the control path PCTL to the PADSIG pad. For example, a PMOS switch transistor MP2 may function as this switch. A source of switch transistor MP2 couples to the PADSIG pad whereas its gate couples to the PX power rail. The drain of switch transistor MP2 is tied to the control path PCTL. As the PX power rail voltage is discharged during a back-power condition, switch transistor MP2 thus switches on to charge the control path PCTL to the PADSIG voltage. In this fashion, buffer transistor MP1 is then switched off by back-power prevention circuit 205 in response to the assertion of the back-power condition such that the PX power rail voltage may safely discharge to ground despite the assertion of the PADSIG voltage by a remote integrated circuit.

Figure 3:
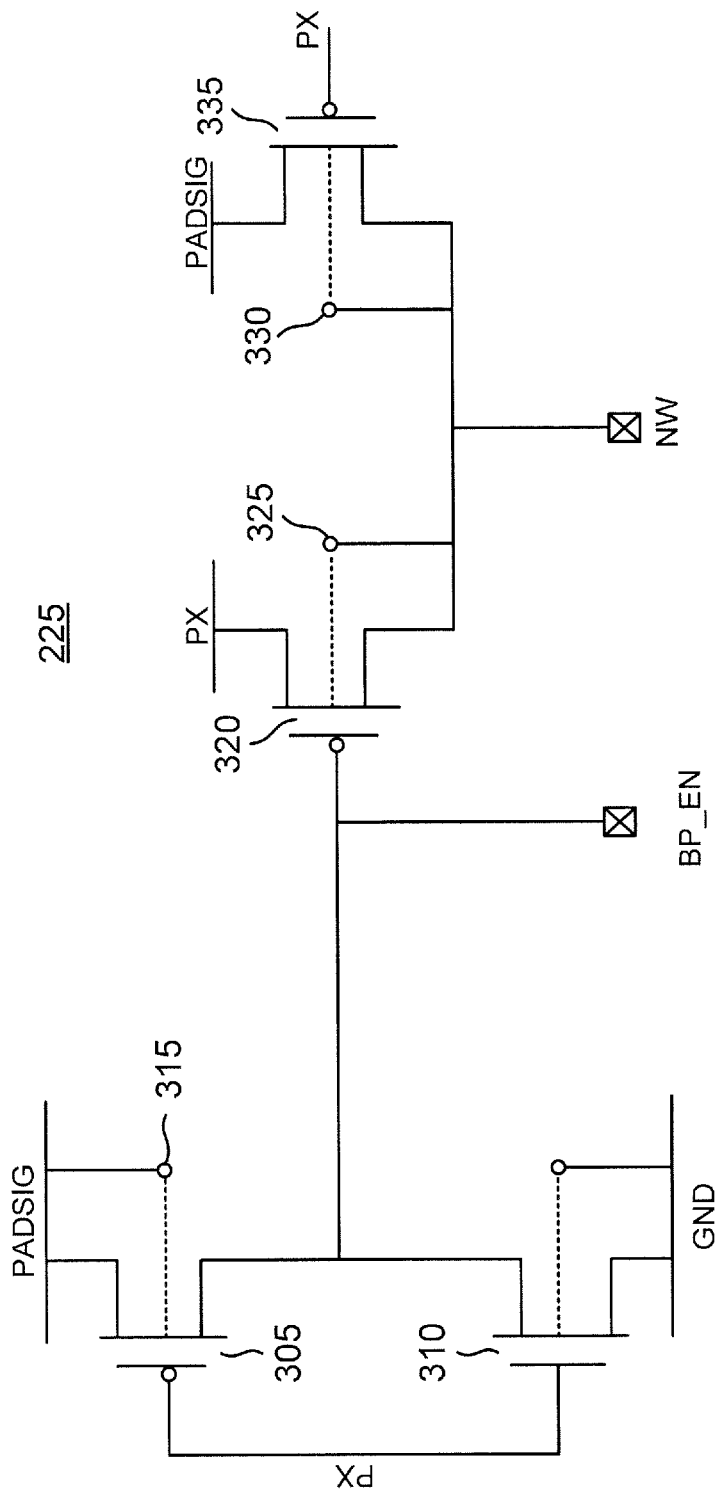
FIG. 3 is a circuit diagram of a control signal generator configured to provide the control signals for the back-power prevention circuit of FIG. 2.

To protect against the formation of a forward-biased p-n junction with respect to an n-well 235 of buffer transistor MP1, a control signal generator 225 generates an n-well bias signal (NW) that biases the n-well to the PADSIG voltage in response to an assertion of the back-power condition. Control signal generator 225 is shown in more detail in FIG. 3. The NW bias signal is produced at a drain of a PMOS transistor 335 and a PMOS transistor 320. The source of PMOS transistor 335 couples to the PADSIG pad. Conversely, the source of PMOS transistor 320 couples to the PX power rail. An n-well 325 for transistor 320 as well as an n-well 330 of transistor 335 are biased by the NW bias signal and thus couple to the drains for these transistors. The PX power rail couples to the gate of transistor 335. In a back-power condition, the PX power rail voltage is discharged such that transistor 335 is then switched on, which charges the NW bias signal to the PADSIG voltage during a back-power condition. Referring again to FIG. 2, since the NW bias signal is then charged to the PADSIG voltage, no forward-biased parasitic diode is formed in buffer transistor MP1 during a back-power condition. Similarly, no forward-biased parasitic diode is formed in transistors 320 and 335 in control signal generator 225 as corresponding n-wells 325 and 330 are also biased by the NW bias signal. Switch transistor MP2 also has its n-well biased by the NW bias signal and is thus also protected from formation of a forward-biased parasitic diode.

As discussed previously, the biasing of the control path PCTL to the PADSIG voltage during the back-power condition could adversely affect pre-driver 215 such that back-power current could conduct into pre-driver 215. Back-power prevention circuit 205 thus functions to switch off (open) a transmission gate 230 that couples between the control path PCTL and pre-driver 215. In particular, control signal generator 205 drives a gate of a PMOS transistor MP3 in transmission gate 230 with a back-power enable (BP_EN) bias signal. In addition, the PX power rail couples to a gate of an NMOS transistor MN3 in transmission gate 230. In a back-power condition, transistor MN3 is thus switched off. To drive BP_EN bias signal to switch off PMOS transistor MP3 in response to the assertion of the back-power condition, control signal generator 225 includes an inverter formed by a serial stack of a PMOS transistor 305 and an NMOS transistor 310. The source for transistor 305 couples to the PADSIG pad and its drain couples to the gate of transistor 320. The source for transistor 310 couples to ground whereas its drain also couples to the gate of transistor 320. The PX rail couples to the gates for transistors 310 and 305, which function as an input node for the resulting inverter. To protect against formation of a forward-biased parasitic diode, the body for transistor 310 is tied to ground whereas the body for transistor 315 is tied to the PADSIG pad. The drains for transistors 305 and 310 function as an output node for the resulting inverter. It is the voltage for this inverter output node that determines the gate voltage for transistor 320 and the BP_EN bias signal voltage.

During a back-power condition, the grounded PX rail switches on transistor 305 so that the BP_EN bias signal equals the PADSIG voltage. In turn, transistor MP3 in transmission gate 230 is switched off by the charging of the BP_EN bias signal to the PADSIG voltage to protect pre-driver 215 from the charged control path PCTL during the back-power condition. To provide further protection for pre-driver 215, back-power prevention circuit 205 may include another switch that closes in response to the assertion of the back-power condition to couple the control path NCTL to ground. This grounding of the control path NCTL ensures that buffer transistor MN1 is switched off when the back-power condition is asserted. For example, an NMOS switch transistor MN2 may couple between ground and the control path NCTL. The BP_EN bias signal drives the gate of switch transistor MN2 so that this transistor switches on during the back-power condition to ground the control path NCTL. To provide yet additional protection, back-power prevention circuit 205 may include a transmission gate 210 coupled between pre-driver circuit 215 and the control path NCTL. The BP_EN bias signal drives the gate of a PMOS transistor MP4 in transmission gate 210. Transistor MP4 is thus switched off in response to an assertion of the back-power condition. The NW bias signal biases the n-well for transistor MP4 to prevent the formation of a forward-biased parasitic diode. The PX power rail couples to a gate of an NMOS transistor MN4 in transmission gate 210 so that this transistor is also off in response to the back-power condition arising.

During normal operation, the PX rail voltage is asserted to a PX power supply level. Transistor 310 in control signal generator 225 will then switch on to ground the BP_EN bias signal. Transistor 335 switches off so that it doesn't matter whether the PADSIG voltage is high or low. In contrast, transistor 320 switches on so that the NW bias signal equals the PX rail voltage. The high state for the PX rail voltage and the low state for the BP_EN bias signal closes (switches on) transmission gates 230 and 210 as is desirable during normal operation. Transistors MP1, MP2, MP3, MP4 in back-power prevention circuit 205 are protected from the formation of a forward-biased parasitic diode during normal operation because their n-wells are then charged to PX rail voltage. In addition, the grounding of the BP_EN bias signal switches off switch transistor MN2 whereas the charging of the PX rail voltage switches off switch transistor MP2. The control paths PCTL and NCTL can thus function in a conventional fashion during normal operation (when the PX rail is powered on).

The combination of switch transistor MP2 and control signal generator 225 may be deemed to comprise a means for coupling a body of a PMOS buffer transistor and a gate of the PMOS buffer transistor to a pad in response to a receipt of an asserted voltage signal at the pad while a power supply rail coupled to the PMOS buffer transistor is powered down. An example method of operation for a back-power prevention circuit such as circuit 205 will now be discussed.

Figure 4:
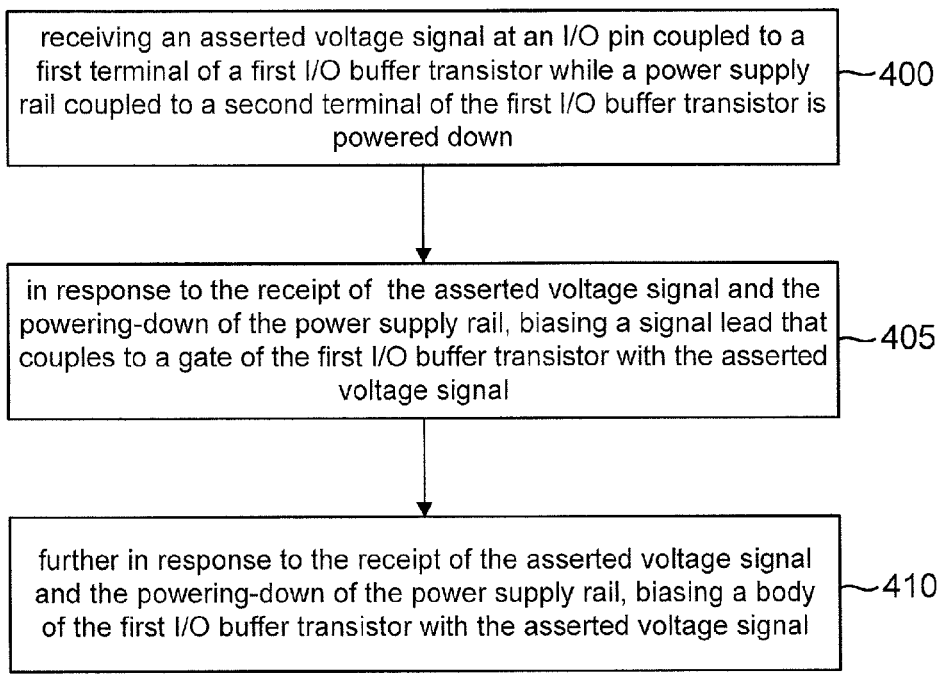
FIG. 4 is a flowchart for an example method of back-power prevention in accordance with an embodiment of the disclosure.

A flowchart for an example method of operation is shown in FIG. 4. The method begins with an act 400 of receiving an asserted voltage signal at a I/O pin coupled to a first terminal of a first I/O buffer transistor while a power supply rail coupled to a second terminal of the first I/O buffer transistor is powered down. An example of act 400 is the assertion of the PADSIG voltage at the drain of buffer transistor MP1 while the PX power rail coupled to its source is powered down. The method also includes an act 405 that occurs in response to the receipt of the asserted voltage signal and the powering-down of the power supply rail and comprises biasing a signal lead that couples to a gate of the first I/O buffer transistor with the asserted voltage signal. The biasing of control path PCTL to the PADSIG voltage through the switching on of switch transistor MP2 is an example of act 405. Finally, the method includes an act 410 that is also in response to the receipt of the asserted voltage signal and the powering-down of the power supply rail and comprises biasing a body of the first I/O buffer with the asserted voltage signal. The biasing of n-well 235 with the PADSIG voltage is an example of act 410.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
    a pad configured to receive a voltage signal from a remote integrated circuit;
    a power supply rail;
    a first buffer transistor having a first terminal coupled to the pad and having a second terminal coupled to the power supply rail;
    a pre-driver configured to drive a gate of the first buffer transistor through a first control path;
    a first switch coupled between the first control path and the pad, the first switch being configured to switch on in response to a power down of the power supply rail; and
    a control signal generator configured to respond to an assertion of the voltage signal while the power supply rail is powered down by coupling a body of the first buffer transistor to the pad.

2. The integrated circuit of claim 1, further comprising:
    a first transmission gate coupled between the pre-driver and the first control path, wherein the power supply rail couples to a gate of an NMOS transistor in the first transmission gate, and wherein the control signal generator is further configured to respond to the assertion of the voltage signal while the power supply rail is powered down by coupling a gate of a PMOS transistor in the first transmission gate to the pad.

3. The integrated circuit of claim 1, wherein the first buffer transistor is a PMOS transistor, the first terminal is a drain, and the second terminal is a source, and the body is an n-well.

4. The integrated circuit of claim 1, wherein the first switch comprises a switch PMOS transistor having a source coupled to the pad and a drain coupled to the first control path, and wherein the power supply rail couples to a gate of the switching PMOS transistor.

5. The integrated circuit of claim 4, wherein the control signal generator is further configured to couple a body of the switch PMOS transistor to the pad in response to an assertion of the voltage signal while the power supply rail is powered down.

6. The integrated circuit of claim 2, wherein the control signal generator comprises:
   a first PMOS transistor having a source coupled to the pad and a drain coupled to the body of the first buffer transistor; and
   an inverter having a power supply node coupled to the pad and having an input node coupled to the power supply rail and an output node coupled to the gate of the PMOS transistor in the first transmission gate.

7. The integrated circuit of claim 6, wherein the control signal generator further comprises a second PMOS transistor having a source coupled to the power supply rail, a gate coupled to the output node of the inverter, and a drain coupled to the body of the first buffer transistor.

8. The integrated circuit of claim 1, further comprising a second buffer transistor having a first terminal coupled to the pad and having a second terminal coupled to ground, wherein the pre-driver is further configured to drive a gate of the second buffer transistor through a second control path.

9. The integrated circuit of claim 8, wherein the second buffer transistor comprises a buffer NMOS transistor having its drain coupled to the pad, a source coupled to ground, and a body coupled to ground.

10. The integrated circuit of claim 8, further comprising a second switch coupled between the second control path and ground.

11. The integrated circuit of claim 10, wherein the second switch comprises an NMOS switch transistor having a drain coupled to the second control path and a drain coupled to ground, and wherein the control signal generator is further configured to couple a gate of the NMOS switch transistor to the pad in response to the assertion of the voltage signal while the power supply rail is powered down.

12. The integrated circuit of claim 11, wherein the control signal generator is further configured to couple the gate of the NMOS switch transistor to the power supply rail while the power supply rail is powered up.

13. The integrated circuit of claim 8, further comprising a second transmission gate coupled between the pre-driver and the second control path, wherein the power supply rail is coupled to a gate of an NMOS transistor in the second transmission gate, and wherein the control signal generator is further configured to couple a gate of a PMOS transistor in the second transmission gate to the pad in response to the assertion of the voltage signal while the power supply rail is powered down.

14. The integrated circuit of claim 13, wherein the control signal generator is further configured to couple the gate of the PMOS transistor in the second transmission gate to ground while the power supply rail is powered up.

15. A method, comprising
receiving an asserted voltage signal at an input/output (I/O) pin coupled to a first terminal of a first I/O buffer transistor while a power supply rail coupled to a second terminal of the first I/O buffer transistor is powered down;
in response to the receipt of the asserted voltage signal while the power supply rail is powered down, biasing a signal lead that couples to a gate of the first I/O buffer transistor with the asserted voltage signal; and
further in response to the receipt of the asserted voltage signal while the power supply rail is powered down, biasing a body of the first I/O buffer transistor with the asserted voltage signal.

16. The method of claim 15, further comprising:
in response to a powering of the power supply rail, isolating both the signal lead and the body of the first I/O buffer transistor from the I/O pin; and
further in response to the powering of the power supply rail, coupling the body of the first I/O buffer transistor to the power supply rail.

17. The method of claim 15, further comprising:
further in response to the receipt of the asserted voltage signal while the power supply rail is powered down, switching off a transmission gate coupled between the signal lead and a pre-driver.

18. A circuit, comprising:
a pad configured to receive a voltage signal from a remote integrated circuit;
a power supply rail;
a PMOS buffer transistor having a drain coupled to the pad and having a source terminal coupled to the power supply rail; and
means for coupling a body of the PMOS buffer transistor and a gate of the PMOS buffer transistor to the pad in response to a receipt of an asserted voltage signal at the pad while the power supply rail is powered down.

19. The circuit of claim 18, further comprising:
a pre-driver configured to drive the gate of the PMOS buffer transistor through a first signal lead; and
a first transmission gate coupled between the first signal lead and the pre-driver; and
means for switching off the first transmission gate in response to the receipt of an asserted voltage signal at the pad while the power supply rail is powered down and for switching on the first transmission gate in response to the power supply rail being powered.

20. The circuit of claim 19, further comprising:
an NMOS buffer transistor in series with the PMOS buffer transistor, wherein the pre-driver circuit is further configured to drive a gate of the NMOS buffer transistor through a second signal lead;
a second transmission gate coupled between the pre-driver and the second signal lead; and
means for grounding the second signal lead and switching off the second transmission gate in response to the receipt of an asserted voltage signal at the pad while the power supply rail is powered down.

* * * * *